United States Patent [19]

Douglas et al.

[11] 4,187,538

[45] Feb. 5, 1980

[54] READ REQUEST SELECTION SYSTEM FOR REDUNDANT STORAGE

[75] Inventors: Robert H. Douglas; Thomas L. Phinney, both of Phoenix, Ariz.

[73] Assignee: Honeywell Inc., Minneapolis, Minn.

[21] Appl. No.: 805,963

[22] Filed: Jun. 13, 1977

[51] Int. Cl.[2] .............................................. G06F 13/00

[52] U.S. Cl. ..................................................... 364/200

[58] Field of Search ... 364/200 MS File, 900 MS File, 364/200

[56] References Cited

U.S. PATENT DOCUMENTS

| | | | |
|---|---|---|---|
| 3,568,160 | 3/1971 | Talarczyk | 364/200 |
| 3,921,145 | 11/1975 | Emm et al. | 364/200 |
| 4,065,809 | 12/1977 | Matsumoto | 364/200 |

*Primary Examiner*—Raulfe B. Zache

*Attorney, Agent, or Firm*—Laurence J. Marhoefer; Lockwood D. Burton

[57] ABSTRACT

There is provided, in accordance with the present invention, apparatus comprising a shared random access memory in which is stored requests for access to data in a bulk memory unit. The data being stored in redundant storage areas and the requests stored in the RAM include the address of the redundant data. Means are provided for determining if that data request is already in progress through one of the redundant addresses. The first of the addresses accessed causes the others to be blocked to prevent multiple accessing of the same data. The checking and selection is accomplished by high speed logic circuitry.

4 Claims, 2 Drawing Figures

FIG. I

START
CHECK FOR COMPLETED REDUNDANCY
SET
RESET
RE-SET
COMPLETED CHECKING
DO THIS REQUEST
TERMINATE THIS REQUEST
TERMINATE
FIRST READ
LATCH
REQUEST ADDRESS
NO NEXT ADDRESS
ADDRESS COMPARE
MULTIPLEXER
SHARED STORAGE
STATUS
REQUEST
NEXT ADDRESS
REQUEST STATUS
LATE START
CLOCK
NEXT ADDRESS REGISTER
CPU
OTHER CONTROLLER
2
4
8
20
22
24
26
28
30
32
34
36
37
38
39
40
42
44
46
48
50
52
54
56
58
60
62

READ REQUEST SELECTION SYSTEM FOR REDUNDANT STORAGE

BACKGROUND OF THE INVENTION

The present invention relates to computer apparatus and, more particularly, to a redundant storage selection means for such a computer apparatus.

In a computer system, there are a number of different types of memory or storage units employed to store the various forms of information required in the operation of the computer. There are registers, latches, and flip-flop circuits at one end of the scale. These are used for the temporary storage of small units of data during the operation of the computer. There are also core storage units and transister logic storage units for random access memories in the middle range of the scale. These are relatively small in storage capacity although larger than the registers and latches. These random access memories are also usually used for the storage of work in progress albeit for somewhat larger blocks of data. These storage units have the advantage of extremely rapid access to the stored data or for the storage for data therein. They do not have the storage capacity needed for the bulk storage of the great mass of data handled by a computer. For such bulk storage, units such as magnetic drum memories or magnetic disc file memories are used. While these bulk storage units do have the storage capacity to store large volumes of data, because they involve rotating mechanisms, their access time is substantially slower than that of the units previously mentioned. Because these magnetic units do not exhibit a high order of reliability, it has been found desirable to store the same information in more than one place in such memory units. The redundant storage of data enhances the reliability of the storage system. If advantage is taken of the separate locations of the redundant storage, rather than merely relying on the additional storage in the event of failure of primary storage location, the average access time to the stored data can be substantially reduced.

SUMMARY OF THE INVENTION

It is, accordingly, an object of the present invention to provide an improved bulk memory means for a computer system.

It is another object of the present invention to provide selection means and method for accessing redundant storage of data in such a computer system.

It is a further object of the present invention to provide an improved selection means and method as set forth to assure the accessing of only one of the redundant records.

In accomplishing these and other objects, there has been provided, in accordance with the present invention, apparatus comprising a shared random access memory in which is stored requests for access to data in a bulk memory unit. The data being stored in redundant storage areas and the requests stored in the RAM include the address of the redundant data. Means are provided for determining if that data request is already in progress through one of the redundant addresses. The first of the addresses accessed causes the others to be blocked to prevent multiple accessing of the same data. The checking and selection is accomplished by high speed logic circuitry.

BRIEF DESCRIPTION OF THE DRAWINGS

A better understanding of the present invention may be had from the following detailed description when read in the light of the accompanying drawings, in which.

DETAILED DESCRIPTION

Figure 1:
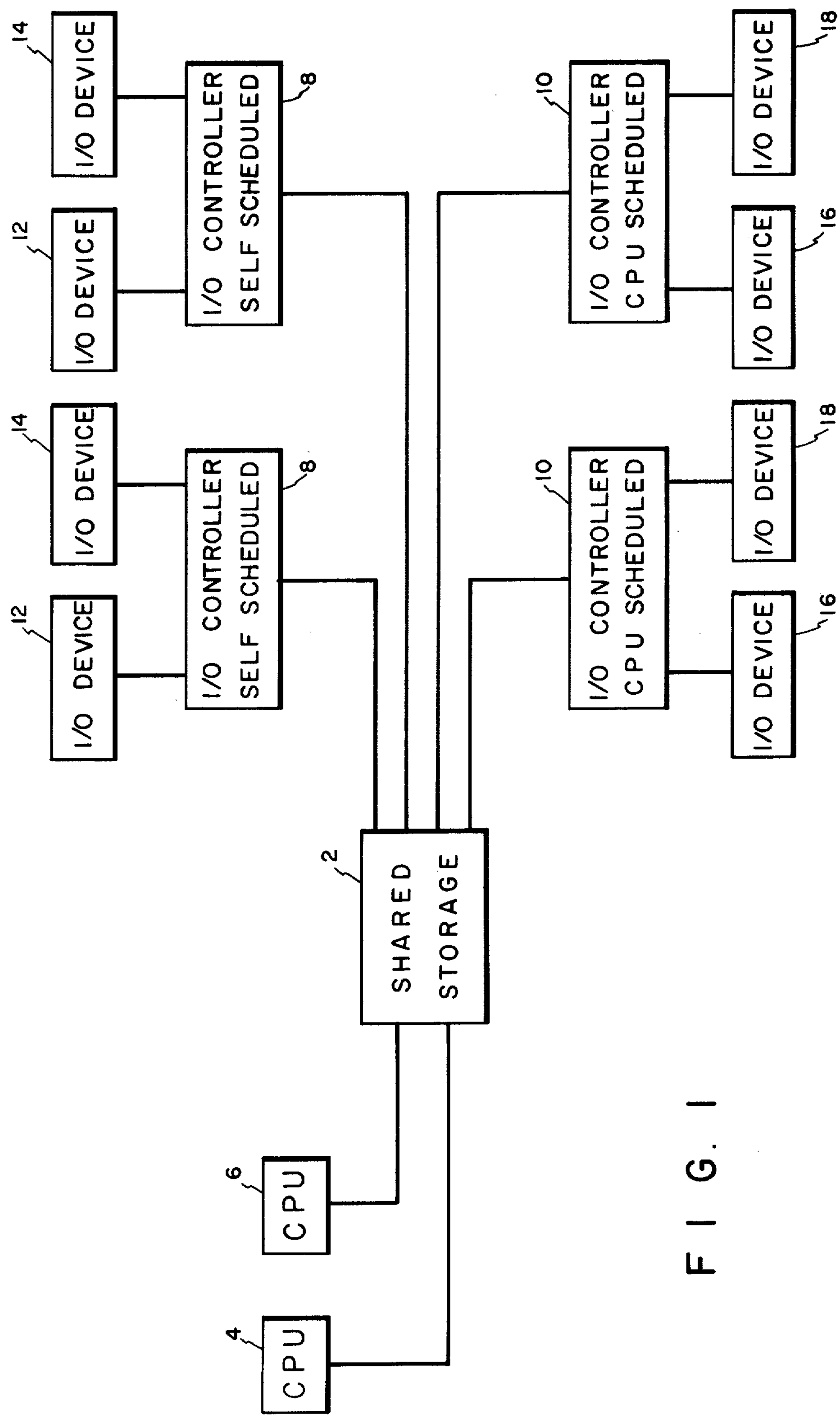
FIG. 1 is a block diagram of a computer system embodying the present invention.

Referring now to the drawings in more detail, there is shown in FIG. 1, the block diagram, elements of a computer system embodying the present invention. A shared storage or memory unit 2 is of the high speed random access memory type. This shared memory 2 may be a part of a larger RAM used for other purposes in connection with the computer system. One or more central processor units (CPU) 4 and 6 are connected to be in communication with the shared storage 2. Also connected to be in communication with the shared storage unit 2 is a plurality of input-output controllers 8 which may be of the self-scheduled type, and a plurality of input-output controllers 10 which may be of the CPU scheduled type. Each I/O controller 8 is operatively connected with a plurality of input-output devices 12 and 14. Similarly, each of the I/O controllers 10 are operatively connected with a plurality of input-output devices 16 and 18.

Through the medium of the shared storage 2, each of the plurality of central processor units 4 and 6 may communicate with any of the several I/O devices 12, 14, 16 or 18 through their respective I/O controllers 8 and 10. In the context of the present invention, primary concern is given to the self-scheduled I/O controllers 8. The I/O controllers 10 are relatively simple devices wherein all of the decision making is accomplished at the CPU. A request for data originating at one of the CPU's 4 or 6 is issued by the CPU as a plural request for the data at all of the addresses in the bulk memory at which that data is stored. As such, the address of each of the storage locations is loaded into the shared storage or memory 2. These addresses, as loaded into the shared memory 2 include cross-references to each other; that is, each request is accompanied by the address or addresses of the redundant storage locations. The self-scheduling I/O controllers 8 recognize the requests and they compare the present status of a given address to determine whether or not that request has been completed by virtue of having been the address of an earlier issued request. If so, the request is terminated. If that request has not been completed or is not in process, then the addresses of the redundant storage locations are queried for status. If the requests at none of the redundant addresses are in progress or have been completed, then the initiating request is marked to be executed.

Figure 2:
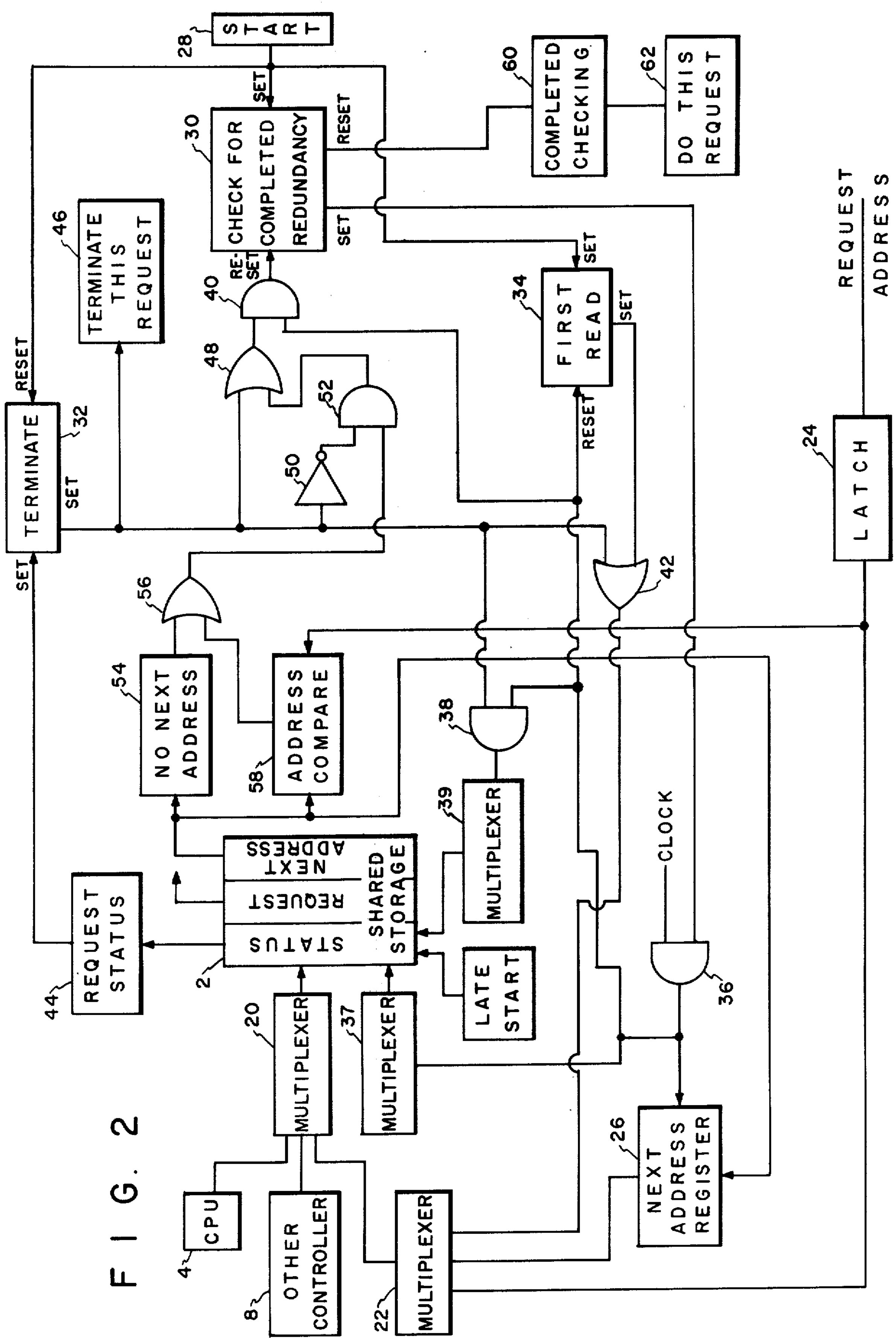
FIG. 2 is a logic block diagram of a selection means in accordance with the present invention.

A better understanding of the foregoing system may be had from a consideration of FIG. 2. In that Figure, one exemplary controller 8 is shown in substantial detail, as well as its relationship to the shared storage, the other controllers 8 and the CPU's 4. There the shared storage unit 2 is shown as including three main storage elements. With respect to each request stored in the shared storage unit 2, there is data relative to its present status, that is, whether it is in process of being served or the service is completed or has not been acted upon. Additionally, relative to each request, there is the address of all redundant storage of the same data. Access to the shared storage unit is through a multiplexer 20, the several inputs to which include other CPU units 4, other controller 8 and an input from this exemplary controller. The input from this exemplary controller into the multiplexer 20 is through a second multiplexer 22. One input to the second multiplexer 22 is connected to a latch 24 which stores an input request address from the CPU. Although the request originated with the CPU, a plurality of such requests may be loaded into a memory unit, such as a RAM, from which and under selective control the address request is applied to the latch 24. Also connected as input to the multiplexer 22 is the output of a Next Address register 26 in which is stored the address of the next sequential redundant address corresponding to the initiating request. The data stored in the Next Address register is obtained from the next address segment of the shared storage unit 2.

A start signal is applied, under programatic control, to an input terminal 28 which is applied as a "set" signal for a flip-flop 30 designated "Check For Completed Redundancy." The start signal is also applied as a "reset" signal for a flip-flop 32 designated "Terminate." The start signal is also applied as "set" input to a third flip-flop 34 designated "First Read." The "set" output of the flip-flop 30 is applied as an enabling signal to one input of an AND gate 36, the other input of which is a clock signal. The output of the AND gate 36 is then a gated clock signal. The gated clock signal is applied, through another multiplexer 37, as an enabling signal for the shared storage unit 2. The gated clock signal output from the AND gate 36 is also applied as an enabling signal for the Next Address register 26, for an AND gate 38, and for an AND gate 40. Additionally, the gated clock signal is applied as a "reset" signal to the First Read flip-flop 34; the "set" output of the First Read flip-flop 34 is applied through an OR gate 42 to the control input of the second multiplexer 22.

It was mentioned that the shared storage unit 2 includes information relative to the status of the requested address. The status signal, indicative that the subject request (1) is in process of being executed, (2) has been completed, or (3) is not being acted upon. That signal is applied to a Request Status detector 44. Either an "in progress" or a "completed" signal at the input of the detector 44 will produce an output signal which is applied as a "set" signal for the Terminate flip-flop 32. The "set" output of the Terminate flip-flop 32 is applied as an input signal to a Terminate module 46 which is operative to terminate the present request. The "set" signal is also applied to another input terminal of the OR gate 42. The same terminate "set" output signal is applied, through one terminal of an OR gate 48, to a second input terminal of the AND gate 40. The same "set" output signal from the flip-flop 32 is applied, through an inverter 50, to one input terminal of an AND gate 52, the output of which is connected to another input terminal of the OR gate 48.

As was mentioned, in the shared storage unit 2, with respect to each request stored therein, is included data relative to the redundantly stored information identified here as Next Address. Output signals from this portion of the shared storage unit are applied to a No Next Address detector 54, the output of which is applied as one input signal to an OR gate 56. The output on the OR gate 56 is connected to another input terminal of the AND gate 52. The next address from the shared storage unit 2 is also applied as one input to an Address Compare unit 58 and to the Next Address register 26. The Next Address data inserted into the Address Compare unit 58 is compared with the address of the initiating request stored in the latch 24. An equal output from the Address Compare unit 58 is applied as a second input to the OR gate 56.

As was mentioned, the output of the OR gate 56 is applied as an input to the AND gate 52, thence, to the one input of the OR gate 48. The output of the OR gate 48 is applied as an enabling signal to the AND gate 40 which is then clocked by the gated clock signal from the AND gate 36 to provide a "reset" signal for the flip-flop 30. The "reset" output of the flip-flop 30 is applied as an input signal to a Completed Checking flip-flop 60, the output of which is connected to a functioning module 62 triggered to execute the present request.

A requested address is stored in the latch 24. When, under programmatic control, the start signal B applied from the unit 28, the Terminate flip-flop 32 is reset and simultaneously therewith the Check for Completed Redundancy flip-flop 30 and the First Read flip-flop 34 are "set". The "set" output from the First Read flip-flop 34 is applied through the OR gate 42 to force the multiplexer 22 to read the request address from the latch 24. The simultaneous setting of the Check for Completed Redundancy flip-flop 30 produces the enable signal at the "set" output thereof for the input of the AND gate 36. This enables the AND gate 36 to produce an output signal upon the occurrence of the next clock signal to produce the gated clock signal. That gated clock signal, through the multiplexer 37, enables the shared storage unit to respond to the signal from the latch 24 by way of the multiplexer 22 and the multiplexer 20, the multiplexers 20 and 37 being operated under programmatic control. When the shared storage has received the request, the status of that request is transmitted to the Request Status detector 44. If, through another routine, the present request is either in the process of being executed or has been executed, the detector 44 produces an output signal which is applied as a "set" signal to the Terminate flip-flop 32. The "set" output signal from the flip-flop 32 is applied as an initiating signal to the module 46 to effect a routine to terminate the present request. The same signal is applied through the OR gate 48 to the enable input of the AND gate 40. Upon the occurrence of the next gated clock signal applied to the other input terminal of the AND gate 40, the flip-flop 30 is "reset". Since the terminate routine in the module 46 had already been instituted, the resetting of the flip-flop 30 does not cause the Completed Checking flip-flop to key into operation the module 62 to accomplish the execution of the present routine. The next gated clock signal, which effectively resets the flip-flop 30, also resets the First Read flip-flop 34 which would allow the multiplexer 22 to change inputs to read the input signal from the Next Address register 26. However, the "set" signal from the Terminate flip-flop 32 is applied through the OR gate 42 to again force the multiplexer 22 to read the address in the latch 24. The "set" signal from the flip-flop 32 is also applied through the AND gate 38 to enable, through a further multiplexer 39, on the next gated clock signal, the status portion of the shared storage whereby to record a Late Start signal in the requested address.

If the Request Status detector 44 has not been set, the Terminate flip-flop 32 would remain in "reset" although the First Read flip-flop 34 would be reset on the next occurring gated clock signal. Under those conditions, the system examines the redundant addresses in the Next Address portion of the shared storage unit 2. If there is no redundant storage of the data represented by the present request, there will be a No Next Address signal. The detector 54 recognizes the No Next Address and transmits a signal through the OR gate 56 to one of the input terminals of the AND gate 52. Since the Terminate flip-flop 32 had not been set, the logical "0" output line is inverted by the inverter 50 to produce an enabling signal on the other input terminal of the AND gate 52. The coincidence of signals on the AND gate 52 produces an output signal which is transmitted through the OR gate 48 to one of the input terminals of the AND gate 40. The AND gate 40 is then triggered on the next gated clock signal from the AND gate 36. The output signal from the AND gate 40 resets the Check for Redundancy flip-flop 30 which, in turn, triggers the Completed Checking flip-flop 60. The output signal from the unit 60 initiates the routine to execute the present request through the module 62. The absence of a Next Address in the shared storage area is indicative that the requested data is stored in but a single storage area and there is no need to further check for redundancy. Now, assume that there was an address of a redundant storage in the Next Address section of the shared storage unit corresponding to the present request. That next address is compared in the comparator 58 with the address in the latch 24. If it is, indeed, a redundant storage address, then the comparator indicates an unequal relationship. That address is also clocked into the Next Address register 26 on the occurrence of the next gated clock signal from the AND gate 36. Since the First Read flip-flop 34 had been reset, the multiplexer 22 is now conditioned to read the output of the Next Address register 26 into the shared storage unit 2 through the multiplexer 20. That redundant address is checked for status as was the original request; and, if it is found that the request is in process of execution or has been completed, the request is terminated as before. If it is not terminated, the next address portion of the shared storage area is examined. Since this check is of a known redundant address, we know that there will be a next address. That next address is again compared in the comparator 58 with the address stored in the latch 24, the original request. If there had been a single redundant storage of the requested data, the correlative address of that redundant storage area would be the address of the original request. Accordingly, the address comparator 58 would indicate an identity of addresses. That identity results in an output signal from the comparator 58 fed through the OR gate 56, the AND gate 52, and OR gate 48, the AND gate 50 to again reset the Check for Completed Redundancy flip-flop 30 and initiate the execution of the request.

If, on the other hand, the requested data had been stored in a plurality of redundant storage areas, the successive redundant addresses would each be examined until one was found that was in process of execution or until the address comparator 58 indicates that the next redundant address is the same as the originating request. Thereupon the request is either terminated or executed in accordance with which routine is initiated.

Thus, it may be seen that there has been provided, in accordance with the present invention, a selection system for redundant storage wherein only one of the redundantly stored messages may be acted upon and wherein all of the stored addresses are randomly exercised.

The embodiments of the invention in which an exclusive property or privilege is claimed are defined as follows:

1. In a computer system having redundant address data storage in a plurality of data storage locations, and a shared random access memory, a method of exclusively selecting one of the redundant addresses when the corresponding data is requested by any of one or more central processor units, said method comprising:

storing information in said shared random access memory relative to an initiating data request including the address, the execution status, and the address of the redundant storage of the requested data, querying said shared random access memory relative to said status, if said request has been executed or is being executed as a result of a previous routine, then terminating the initiating request, if said request is not being or has not been executed, then querying said random access memory relative to said redundant address, if said random access memory indicates no redundant address, then initiating a routine to execute the initiating request, if said random access memory includes a redundant address, then querying said random access memory relative to the execution status of said redundant address, if said redundant address status is indicated as being completed or in progress, then terminating the initiating request, and if said redundant address status is not indicated as being completed or in progress, then initiating said routine for executing the initiating request.

2. In a computer system having redundant address data storage in a plurality of data storage locations, and a shared random access memory, a method of exclusively selecting one of the redundant addresses when the corresponding data is requested by any of one or more central processor units, said method comprising:

(a) storing information in said random access memory relative to an initiating data request, including the address, the execution status, and the address of the redundant storage of the requested data;

(b) querying said shared random access memory relative to said status;

(c) if said request has been executed or is being executed as a result of a previous routine, then terminating the initiating request, (d) if said request is not being or has not been executed, then querying said random access memory relative to said redundant address, (e) if said random access memory indicates no redundant address, then initiating a routine to execute the initiating request, (f) if said random access memory indicates a redundant address, then querying said random access memory relative to execution status of said redundant address, (g) if said redundant address is indicated as being completed or in progress, then terminating the initiating request, (h) if said redundant address is not indicated as being completed or in progress, then querying said random access memory relative to a further redundant address, (i) comparing said further redundant address with the address of said initiating request, (j) if said further redundant address is the same as said address of said initiating request, then initiating said routine to execute the initiating request, (k) if said further redundant address is different from said address of said initiating request, then querying said random access memory relative to the execution status of said further redundant address, (l) if said further redundant address is indicated as being completed or in progress, then terminating said initiating request, and (m) if said further redundant address is not indicated as being completed or in progress, then repeating steps (h) through (l) until said request is executed or terminated in accordance therewith.

3. In a computer system having redundant address data storage in a plurality of data storage locations, means for exclusively selecting one of the redundant addresses when the corresponding data is requested by any of one or more central processor units, said selecting means comprising:

a shared random access memory unit, means for storing in said random access memory unit information relative to an initiating data request, including the address, the execution status, and the address of the redundant storage of the requested data, means for querying said shared random access memory relative to said status, means responsive to a first status signal, indicative of execution of said request, for terminating said request, means for querying said shared random access memory relative to said redundant address, means responsive, in the absence of said first status signal, to a first redundant address signal, indicative of no redundant address, for initiating the execution of the initiating request, means responsive to a second redundant address signal, indicative of a redundant address for the requested data, for effecting a querying of the execution status of said redundant address, means responsive to a status signal indicative of execution at said redundant address, for terminating said initiating request, and means responsive, in the absence of said last mentioned status signal, to a further redundant address signal, for initiating the execution of said initiating request.

4. In a computer system having redundant address storage in a plurality of data storage locations, means for exclusively selecting one of the redundant addresses when the corresponding data is requested by any of one or more central processor units, said selecting means comprising:

a shared random access memory unit, means for storing in said random access memory unit information relative to an initiating data request, including the address, the execution status, and the address of the redundant storage of the requested data, means including a first detector for querying said shared random access memory relative to said status, said first detector being set in response to a first status signal indicative of execution of said request, means including a flip-flop responsive to be set by a set condition of said first detector, and means responsive to the setting of said flip-flop to effect the termination of the initiating request, means including a second detector for querying said shared random access memory relative to said redundant address, said second detector being responsive to a first redundant address signal indicative of no redundant address to produce an output signal, and means responsive, in the absence of said first status signal, to said output signal from said second detector for initiating the execution of the initiating request, means responsive to a second redundant address signal, indicative of a redundant address for the request data, for effecting a querying of the execution status of said redundant address, said means including said first detector being responsive to a status signal indicative of execution at said redundant address for effecting the termination of said initiating request, and means responsive, in the absence of said last mentioned status signal, to a further redundant address signal for initiating the execution of said initiating request.

* * * * *